United States Patent [19]
Afek et al.

[11] Patent Number: 5,430,868
[45] Date of Patent: Jul. 4, 1995

[54] SHARED MEMORY WITH BENIGN FAILURE MODES

[75] Inventors: Yehuda Afek; Michael J. Merritt, both of Berkeley Heights; Gadi Taubenfeld, Murray Hill, all of N.J.

[73] Assignee: AT&T Corp., Murray Hill, N.J.

[21] Appl. No.: 125,970

[22] Filed: Sep. 23, 1993

[51] Int. Cl.⁶ ............................................. G06F 11/00
[52] U.S. Cl. ........................... 395/575; 364/DIG. 1; 364/DIG. 2; 364/265; 364/265.3; 364/943.9; 364/943.91; 364/944.2
[58] Field of Search ......... 364/DIG. 1MS File, DIG. 2MS File, 364/; 395/250, 375, 400, 425, 575; 371/7, 8.1, 10.1, 10.2, 10.3, 14

[56] References Cited

U.S. PATENT DOCUMENTS 5,278,847  1/1994  Helbig, Sr. et al. ............... 371/40.2

OTHER PUBLICATIONS

M. Herlihy, "Wait–Free Synchronization", ACM Transactions on Programming Languages and Systems, vol. 11, No. 1, Jan. 1991, pp. 124–149.

Y. Afek, D. S. Greenberg, M. Merritt, Ga. Taubenfeld, "Computing with Faulty Shared Memory", *Proceedings 11th ACM Symposium on Principles of Distributed Computing,* Aug. 1992.

P. Jayanti, T. D. Chandra, S. Toueg, "Fault–Tolerant Wait–Free Shared Objects", *Proceedings of the 33rd Annual Symposium on Foundations of Computer Sciences,* Oct. 1992.

*Primary Examiner*—Robert B. Harrell
*Attorney, Agent, or Firm*—Gordon E. Nelson

[57] ABSTRACT

Memories which have new benign failure modes. The new failure modes are the omission-crash mode and the eventual-crash mode. Memories having either of these modes fail more benignly than memories having the omission failure mode, but unlike memories having the crash failure mode, memories with the novel failure modes may be used to construct gracefully-degrading fault tolerant objects. Implementations of memories with the new failure modes are disclosed, along with implementations of fault-tolerant objects made from memories with the new failure modes.

9 Claims, 4 Drawing Sheets

SHARED MEMORY WITH BENIGN FAILURE MODES

BACKGROUND OF THE INVENTION

1. Field of the Invention

The invention concerns memory for computer systems generally and more specifically concerns memory which is shared among processes which have concurrent access to the memory.

2. Description of the Prior Art

Increasingly, systems which are themselves implemented by means of computer systems are designed as systems in which a number of processes performing various system functions share memory. In such shared memory systems, the memory is concurrently accessed by the processes, and the processes communicate with one another by setting and reading values in the shared memory.

A major goal in the design of modern computer-implemented systems is fault tolerance, that is, the ability of the system to keep on functioning in the presence of the failure of some of its components. An important part of fault tolerance is benign failure modes: when a component of a system finally does fail, the failure should be such that the rest of the system can easily deal with it. An example of a benign failure mode for a processor is the stop failure mode: when the processor fails, it simply stops, rather than continuing to operate in an erroneous fashion.

In shared memory systems, it is of course crucial that the shared memory be fault tolerant, and it is desirable that it have a benign failure mode. Recent research has demonstrated that it is possible to build a fault-tolerant shared memory from potentially faulty components, as long as the number of faulty components does not exceed a threshold value. See Yehuda Afek, David Greenberg, Michael Merritt, and Gadi Taubenfeld, "Computing with faulty shared memory", in *Proceedings of the 11th ACM Symposium on Principles of Distributed Computing*, August, 1992.

Two types of benign failure of shared memories have also been investigated: the crash mode and the omission mode. See P. Jayanti, T. Chandra, and S. Toueg, "Fault-tolerant wait-free shared objects", in *33rd Annual Symposium on the Foundations of Computer Science*, IEEE Computer Society Press, October, 1992. The crash mode is like the stop mode for processes: the failure of the memory appears to the processes which are sharing it to be complete and instantaneous; memory operations performed by a process preceding the failure behave correctly; memory operations performed after the failure return a special value which indicates that the operation was not performed. The special value is represented in the following by the * symbol. In the omission mode, memory operations performed on the shared memory by a process during and after a failure do not behave correctly, but instead return a special value which indicates that the operation may or may not have been performed. The special value is represented in the following by the ? symbol. The difficulty with the omission mode is that once a failure has occurred, a process never again knows definitely whether a memory operation was performed. The omission mode is thus substantially less benign than the crash mode.

A problem which the foregoing work has not solved is the construction of gracefully-degrading fault-tolerant memories from components having very benign failure modes. A gracefully-degrading fault-tolerant memory is one whose failure mode is at least as benign as the failure modes of its components. The Jayanti reference above demonstrates that it is not possible to construct a gracefully-degrading fault-tolerant memory from components having the crash failure mode, but that it is possible to construct a gracefully-degrading fault-tolerant memory from components having the omission mode.

What is needed, and what is provided by the present invention, is memories with the following properties:
- they have failure modes which are more benign than the omission mode; and
- they may be used to construct fault-tolerant memories which are gracefully degrading.

SUMMARY OF THE INVENTION

The shared memories of the invention have novel failure modes which are more benign than the omission mode, but which permit construction of fault-tolerant memories which are gracefully degrading. The most benign of the novel failure modes is an omission-crash mode, which, like the crash mode, assumes an instantaneous and complete failure, but which takes into account the fact that the memory operation performed by the process is not instantaneous. In memories with the omission-crash mode, the memory performs operations finished before the failure correctly, may return ? on operations begun before the failure and finished after the failure, and returns * on all operations begun after the failure. Fault-tolerant memories may be constructed with components having the omission-crash mode which themselves have the omission-crash failure mode, and are therefore gracefully degrading.

A somewhat less benign novel failure mode is an eventual-crash mode, which takes into account both the fact that the memory operation is not instantaneous and the fact that the failure is often not instantaneous. A memory with the eventual-crash failure mode may return ? at any time before the failure is complete; however, once it has returned ?, it is guaranteed to begin returning * on all operations at some subsequent time. Fault-tolerant memories may be constructed with components having the eventual-crash failure mode which themselves have the eventual-crash or the omission-crash failure mode and are therefore gracefully degrading.

Other objects and advantages of the apparatus and methods disclosed herein will be apparent to those of ordinary skill in the art upon perusal of the following Drawing and Detailed Description, wherein:

Figure 1:
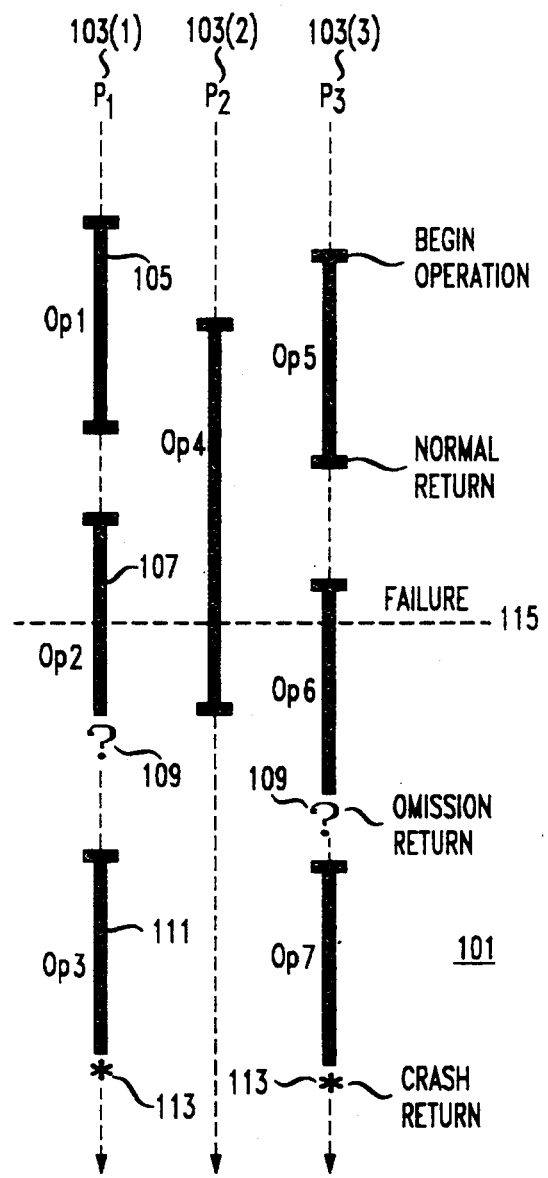
FIG. 1 is a drawing illustrating the omission-crash mode.

Reference numbers in the Drawing have two parts: the two least-significant digits are the number of an item in a figure; the remaining digits are the number of the figure in which the item first appears. Thus, an item with the reference number 201 first appears in FIG. 2.

DETAILED DESCRIPTION OF A PREFERRED EMBODIMENT

The Detailed Description will first describe the novel benign failure modes in detail, will then show how a memory may be constructed which has the novel benign failure modes, and will conclude by showing how memories having the novel benign failure modes may be constructed from components having the benign failure modes.

Figure 2:
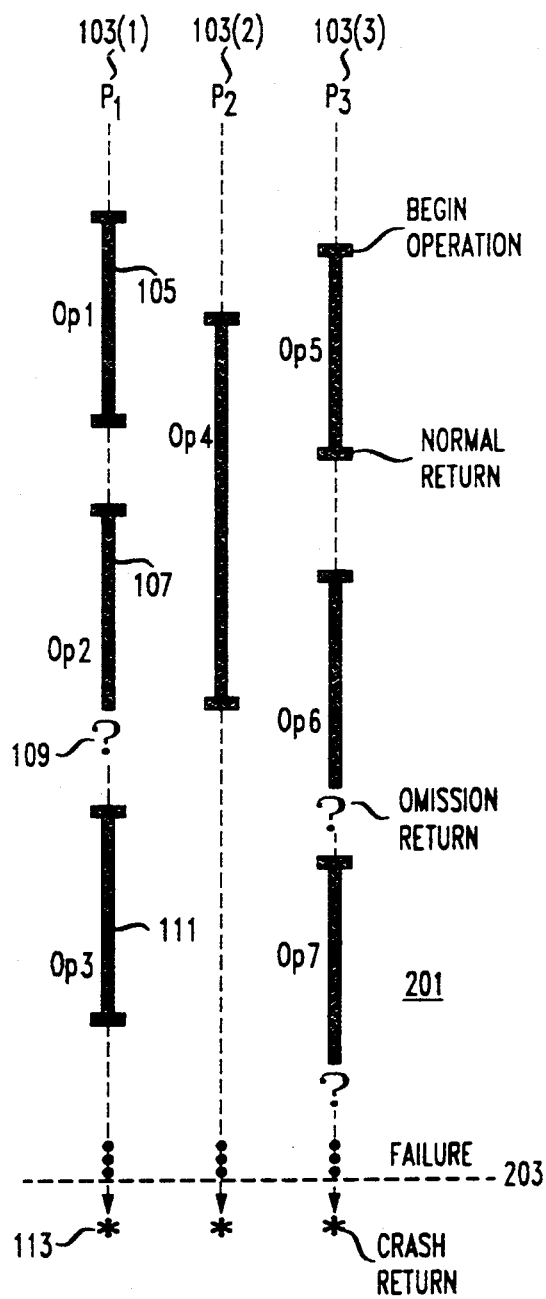
FIG. 2 is a drawing illustrating the eventual-crash mode.

The Benign Failure Modes: FIGS. 1 and 2

The first benign failure mode is the omission-crash failure mode. In this mode, memory operations finished before the memory failure are performed correctly, memory operations begun before the failure and finished thereafter may be performed correctly or may return ?, and always returns * on operations begun after the failure.

FIG. 1 is a schematic diagram of omission-crash failure mode 101. Three process 103, P1 103(1), P2 103(2), and P3 103(3) are concurrently performing operations on a shared memory with omission-crash failure mode. P1 performs Op1, Op2, and Op3, P2 performs Op 4, and P5 performs Op5, Op6, and Op7. While these operations are being performed, a failure 115 occurs at the point in time indicated by the heavy dashed line.

FIG. 1 shows what happens to the operations. Op 1 and Op 5 are finished before the failure 115, and are guaranteed to be normal operations 105. Op2, Op4, and Op6 are begun before the failure and finished after the failure; they may be normal operations 105 or omission operations 109, which return ? 109. In FIG. 1, Op2 and Op6 are omission operations 107, while Op4 is a normal operation 105. Op3 and Op 7 are begun after failure 115, and they are both crash operations 111, which return * 113.

The second benign failure mode is the eventual-crash mode. In this mode, any operation can return ?, but once an operation does return ?, there must be a crash and all operations begun subsequent to the crash must return * FIG. 2 is a schematic diagram of eventual-crash failure mode 201. Again, there are three processes P performing memory operations on a memory with the eventual crash failure mode. The heavy dashed line marks the time at which failure 203 has become complete. All of the operations shown begin prior to the completion of failure 203; some of them are normal operations 105, and others are omission operations 109, returning ?. All operations beginning after the time at which failure 203 becomes complete are crash operations 111, returning * 113.

An important characteristic of the eventual-crash failure mode is that it can be used to simulate the omission-crash failure mode. If the memory has idempotent operations, the process can react to the first omission return it receives by continuing to perform the idempotent operation until the failure is complete and the process receives the crash return.

Figure 3:
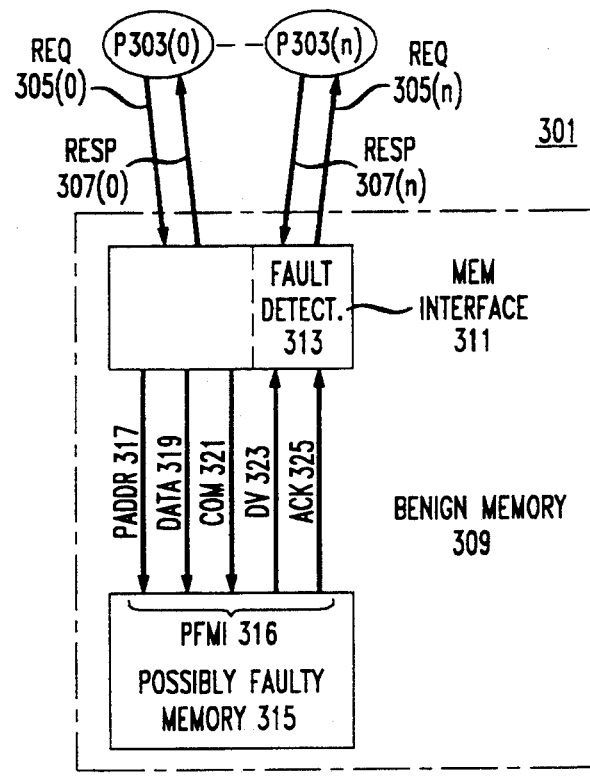
FIG. 3 is a drawing showing how a memory with a benign failure mode is constructed from a memory which does not have a benign failure mode.
Figure 4:
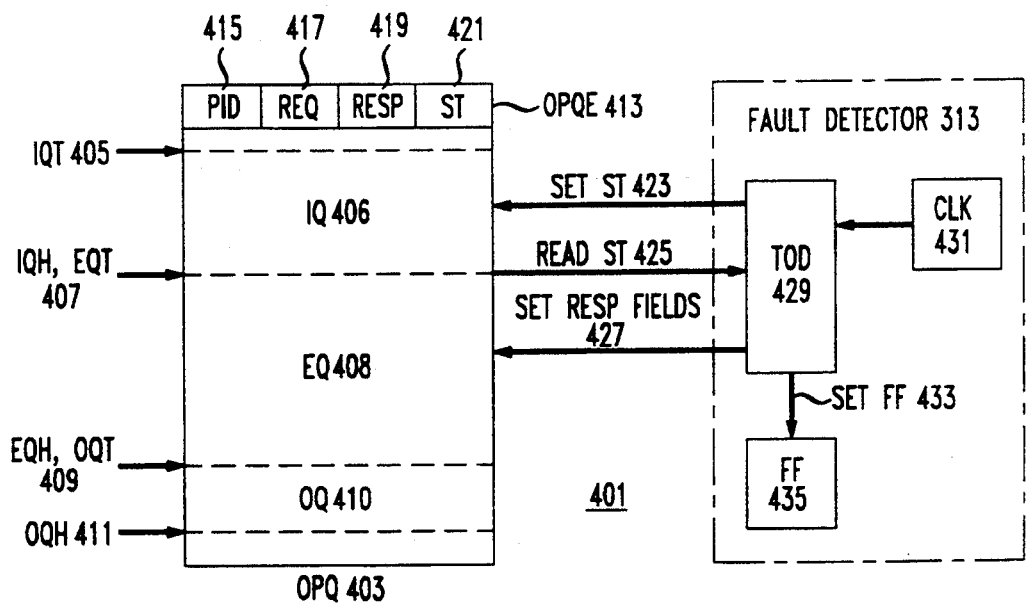
FIG. 4 is a drawing showing an implementation of a memory with the omission-crash failure mode.

Implementing Memories with the Benign Failure Modes: FIGS. 3 and 4

Of course, the actual devices used to implement memories do not have benign failure modes. FIG. 3 shows in overview how a memory device which does not have a benign failure mode is made into a benign memory which does have such a mode. In system 301 of FIG. 3, a number of processes P 303 concurrently perform operations on benign memory 309. When a process P 303 performs such an operation, it sends a request 305 requesting the operation to benign memory 309. Process 303 will then wait for a response 307 from benign memory 309. For example, if the operation is a memory read operation, the request will specify the address of the data and the response will return the data. As previously mentioned, part of benign failure is guaranteeing that there will always be a response from benign memory 309.

Benign memory 309 has two components: memory interface 311, which is typically provided by a processor, and possibly faulty memory 315, which is where the data is actually stored. Memory interface 311 responds to a request 305 by causing possibly faulty memory 315 to perform the actions necessary to satisfy the request and returning the results of the actions. Further, as indicated by its name, possibly faulty memory 315 may fail in a malicious fashion. It is memory interface 311 which causes benign memory 309 to have the benign failure mode. Fault detector 313 in memory interface 311 detects a fault in the operation of memory 315 and when it occurs, causes memory interface all to behave as required by the benign failure mode.

Possibly faulty memory may be constructed from any type of storage device. The exact interface between memory interface 311 and possibly faulty memory 315 will depend on the nature of the storage device; in FIG. 3, possibly faulty memory interface (PFMI) 316 carries the following signals:

- PADDR 317 carries a physical address in memory 315 from memory interface 311 to memory 315;
- DATA 319 carries data between memory 315 and memory interface 311;
- COM 321 carries a memory command to memory 315 from memory interface 311;
- DV 323 indicates that DATA 319 is presently carrying valid data read from memory 315; and
- ACK 325 indicates that possibly faulty memory 315 has received and stored the data on data 319.

Because possibly faulty memory 315 is not benign, it may simply not respond to a memory command 321. For example, if the command is a write command, it may never provide an acknowledgement signal 325 to memory interface 311; similarly, if it is a read command, memory interface 311 may never receive data valid signal 323. From the point of view of memory interface 311, possibly faulty memory 315 simply times out. Benign memory 309, however, cannot time out, since it must always provide a response 307 to each request 305. Fault detector 313 in memory interface 311 must consequently detect the time out and when a time out is detected, memory interface 311 must respond as required by the benign failure mode of memory 309. In the present case, if benign memory 309 has the omission-crash mode, it must provide responses as required by that mode, and if it has the eventual-crash mode, it must provide responses as required by that mode.

A presently-preferred implementation of the part of memory interface 311 which provides the responses required by the failure mode is shown in FIG. 4. Portion 401 of memory interface 3111 includes operation queue 403 and fault detector 313. Operation queue 403 contains an operation queue entry (OPQE) 413 for requests 305 made by processes 303. An entry 413 remains in operation queue 403 from the time a request 305 is received in memory interface 311 until the time memory interface 311 provides the response to the request to process 303. Each entry 413 includes at least the following information:

PID 415, an identifier for the process 303 making the request;

REQ 417, the request from the process 303;

RESP 419, the response which memory interface 311 will provide to the process 303 when it has finished the memory operation; and start time (ST) 421, the time at which memory interface 311 began performing the actions on memory 315 required by the memory request.

Operation queue 403 is further divided into three subqueues: input queue 406, execution queue 408, and output queue 410. An operation queue entry 413 remains in input queue 406 from the time the memory request recorded in entry 413 is received in memory 309 until the time memory interface 311 begins performing the operations required to satisfy the request on memory 315. At that time, it becomes part of execution queue 408, where it remains until memory interface 311 has received the results of its operations on memory 315; then it becomes part of output queue 410, where it remains until memory interface all returns the results of the request to the process in response 307. Pointer 405 identifies the tail of input queue 406, pointer 407 identifies the head of input queue 406 and the tail of execution queue 408, pointer 409 identifies the head of execution queue 408 and the tail of output queue 410, and pointer 411 identifies the head of output queue 411.

Fault detector 313 contains three main components: clock 431, which has a monotonically increasing clock value, time out detector (TOD) 429, which detects timeouts, and failure flag 435, a register which indicates whether a fault has occurred. As indicated by arrows 430, 423, 425, 427, and 433, time of day 429 is responsive to the output of clock 432 and it in turn sets and reads start time 421, sets response 419, and sets fault flag 435.

Apparatus 401 operates as follows: when memory interface 311 is ready to begin carrying out the request by means of commands to possibly faulty memory 315, it sets pointer 407 so that it points to the item at the head of input queue 406, which thus becomes the tail item in execution queue 408. At that time, timeout detector 429 sets field ST 421 from the current value provided by clock 431. When memory interface 311 receives a data valid signal 323 or an acknowledgement signal 325 from memory 315, it sets pointer 409 so that the entry 413 which was at the head of execution queue 408 is at the tail of output queue 410.

While the above is going on, time out detector 429 periodically compares the value of ST field 421 in the entry 413 at the head of execution queue 408 with the current value of clock 431. If the difference is greater than a threshold value, possibly faulty memory 315 has timed out. Time out detector 429 responds to this fact by setting failure flag 435 and by setting the response fields 419 in the entries 413 in execution queue 408 to indicate the ? response and the response fields 419 in the entries 413 in input queue 406 to indicate the * response. Memory interface 311 responds to set fault flag 435 by emptying operation queue 403 without regard to the subqueues and by immediately setting RESP 419 in queue entries 413 for new requests 305 to indicate the * response.

Since all of the memory requests which were already processed when the time out occurred are in output queue 410, while all those which were being currently processed by possibly faulty memory 315 when the time out occured are in execution queue 408, and all those whose processing had not yet begun are in input queue 406, the above mode of operation ensures that all of the requests which were processed prior to detection of the time out receive correct responses, all of those being processed when the time out occured receive ? as their response 307, while all of those whose processing by memory 315 had not yet begun receive * as their response. Benign memory 309 thus implements the omission-crash failure mode.

Implementation of the eventual-crash failure mode is even simpler. Timout detector 429 in such an implementation simply sets fault flag 435. Memory interface 311 responds to the flag by emptying operations queue 403 until output queue head 411 equals input queue head 407; while emptying the queue to that point, memory interface 311 sets RESP field 419 in each entry to ?. Thereupon, memory interface 311 continues emptying operations queue 403, but sets RESP field 419 in each entry to *. Thus, any operation which precedes the crash may receive ? as its response, and all operations which follow the crash receive *, as required by the eventual-crash failure mode.

Figure 5:
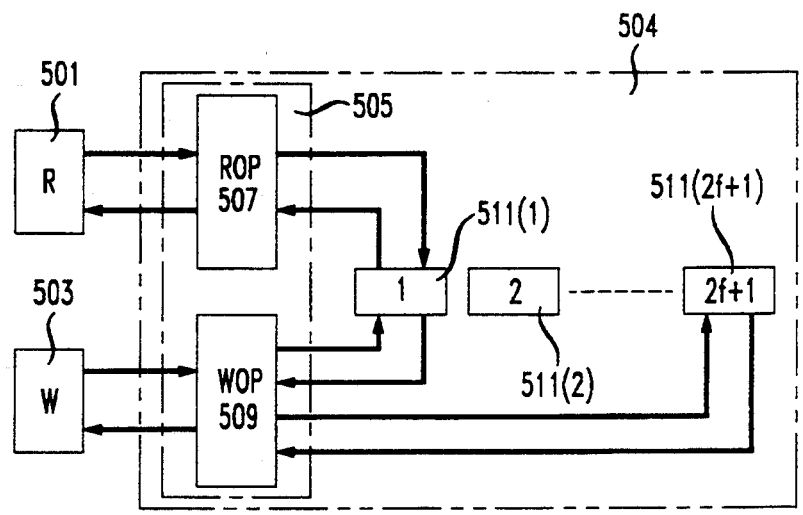
FIG. 5 is a drawing showing an implementation of a fault-tolerant safe register from safe registers having the omission-crash failure mode.
Figure 6:
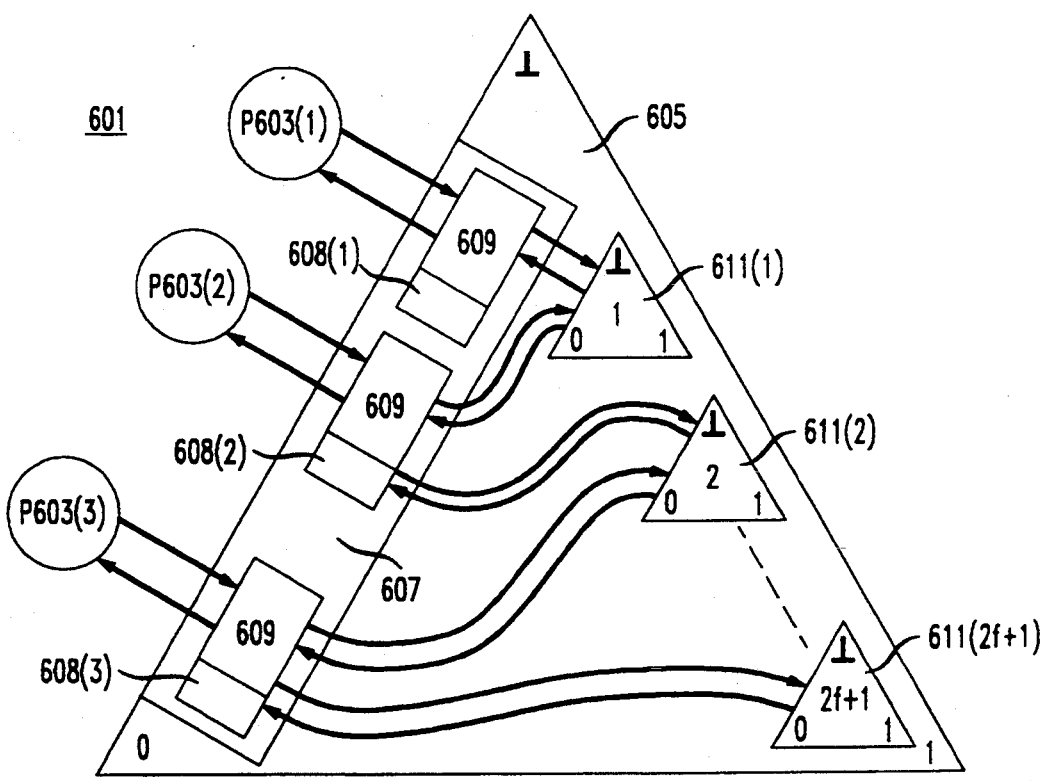
FIG. 6 is a drawing showing an implementation of a fault-tolerant shared consensus object from consensus objects having the omission-crash failure mode.
Figure 7:
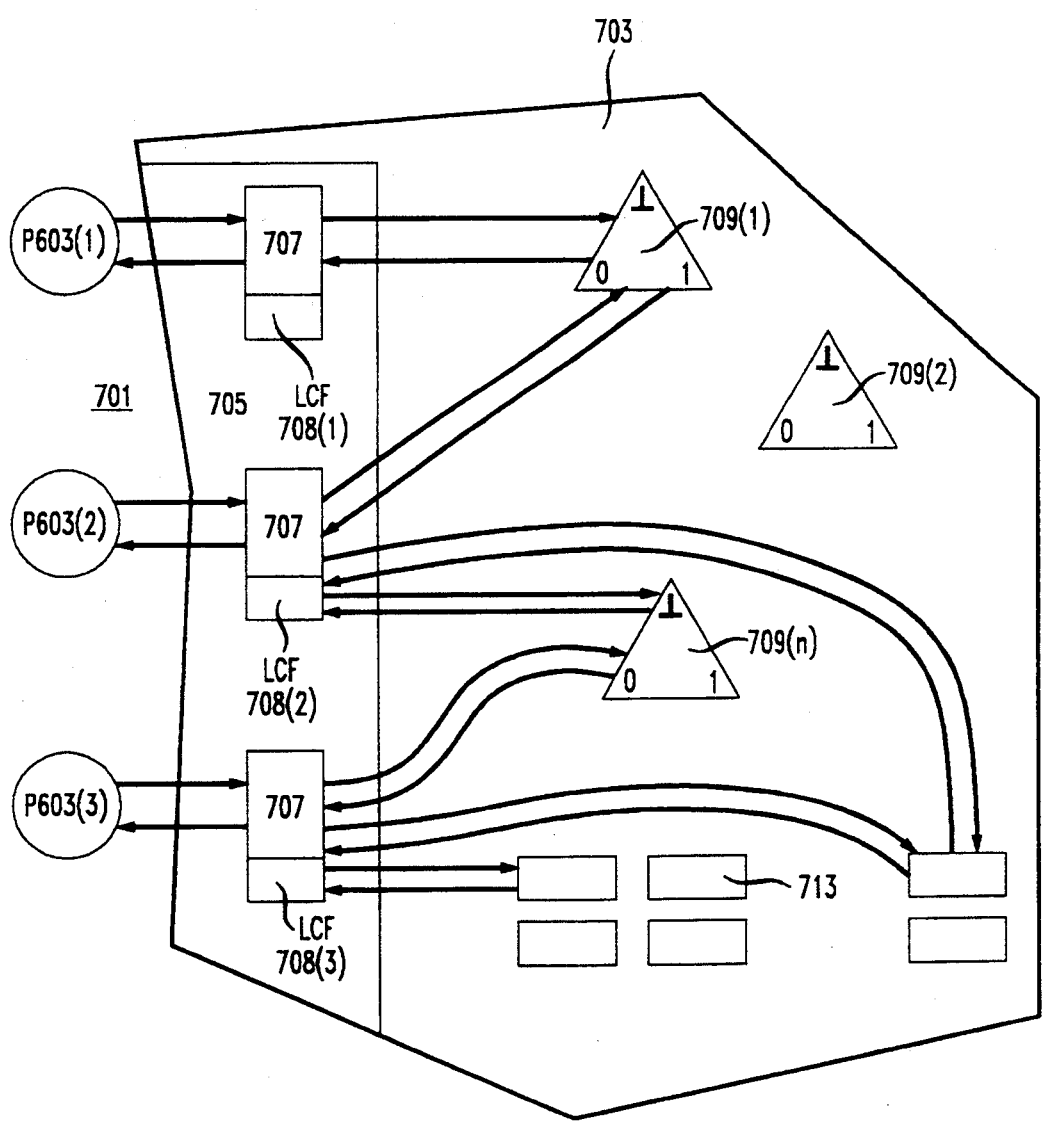
FIG. 7 is a drawing showing an implementation of a constructed memory with the omission-crash failure mode.

Fault-Tolerant Memories Constructed from Benignly-Failing Components: FIGS. 5–7

As set forth in the Description of the Prior Art, it is possible to build fault-tolerant memories from non-fault-tolerant components. It is particularly advantageous to build such memories from non-fault-tolerant components having the omission-crash or eventual-crash failure modes because fault-tolerant memories built from such components degrade gracefully. In the following, a number of examples of such memories will be presented.

A Fault-Tolerant Safe Register: FIG. 5

FIG. 5 shows a a fault-tolerant safe read/write register 504. A safe read/write register is one which has the following properties;

a read operation that does not overlap with a write operation returns the last value written to the register; and a read operation that overlaps with a write operation returns an arbitrary value.

Memory 504 is further f fault-tolerant, that is, it will continue to function until more than f of its component memories have failed.

Memory 504 is used by a single writing process 503 and a single reading process 501 to communicate with each other; process 503 writes to the safe register and process 501 reads what process 503 has written. Memory 504 contains memory interface 505 and 2f+1 non-fault-tolerant safe registers 511 with omission-crash failure modes. Interface 505 in turn contains read operation code (ROP) 507, which restrands to read operations from process 501 and write operation code (WOP) 509, which responds to write operations from process 503.

Write operation code 509 responds to the write operation by writing the value received from write process 503 to all 2f+1 of the non-fault tolerant safe registers 511. If more than f of the registers return the crash value * to memory interface 505, write operation code 509 returns * to write process 503; if fewer than f+1 of the registers return success, write operation code 509 returns ? to write process 503; otherwise, it returns a value indicating that the write operation succeeded.

Read operation code 507 responds to the read operation by reading the contents of all of the non-fault tolerant safe registers 511. If f+1 of the registers contain the same value, read operation code 507 returns that value to read process 501; if more than f of the registers return *, read operation code 507 returns * to read process 501; if fewer than f+1 of the registers return values other than * or ?, read operation code 507 returns ?. As can be seen from the foregoing, safe register 504 is f fault-tolerant; further, safe register 504, like its component safe registers, has an omission-crash failure mode, and safe register 504 is consequently gracefully degrading. It should be noted here that safe register 504 may be constructed from safe registers 511 having the omission-crash or the eventual-crash failure modes, but cannot be constructed from safe registers 511 having the omission failure mode.

A Fault-tolerant Consensus Object: FIG. 6

FIG. 6 shows an f fault tolerant gracefully degrading consensus object 605 which is constructed from 2f+1 non-fault-tolerant consensus objects 611 which have the crash-omission failure mode. A consensus object is a memory which has the following properties:
  a process may perform only two operations on a consensus object: propose 0 and propose 1;
  The operations work like this: the consensus object returns the value proposed in the first propose operation performed on the object to the process that performed the first propose operation and returns the same value to all further propose operations performed on the object.

Thus, in FIG. 6, any one of the three processes 603 may perform the propose operation; if the one performing the propose operation is the first to do so, consensus object 605 will return the proposed value to the first process 603 and will then continue to return that value to all processes 603 which perform the propose operation. As before, a memory interface 607 turns the 2f+1 consensus objects 611 into a single fault-tolerant consensus object 605. The boxes 609 in memory interface 607 indicate only that memory interface 607 treats each process's propose operations separately. Included in box 609 is a local crash flag 608 for each process. As will be seen in more detail later, it is the crash flags which implement the omission-crash failure mode in consensus object 605.

Also as before, the non-fault-tolerant consensus objects 611 have the omission-crash failure mode; consequently, each consensus object 611 may return the value to which it was set by the first propose operation, the ? omission return, or the * crash return. Consensus object 605 may return the value, ?, or * to a process 603 in response to a propose operation. In a preferred embodiment, these values are returned as follows:

On the first propose operation, if more than f of the consensus objects 611 return the value, memory interface 607 returns the value to the process 603 performing the first perform operations; if more than f of the consensus objects 709 return ? or *, memory interface 607 returns ? to the process and sets all of the local crash flags 608.

On subsequent propose operations, memory interface 607 first examines the local crash flag 608 for the process performing the operation; if the crash flag 608 is set, memory interface 607 simply returns *. If the crash flag 608 is not set, the operation returns the values set in the first propose operation. Again, if more than f of the consensus objects 611 return the value, memory interface 607 returns the value to the process 603; if more than f of the consensus objects 611 returns ? or *, memory interface 607 returns ? to the process and sets local crash flags 608 for all of the processes. Consensus object 605 is thus f fault tolerant and has the omission-crash failure mode, and since it is made up of objects with the omission-crash failure mode, it is gracefully degrading.

Using Consensus Objects and Safe Registers to Construct other Types of Objects: FIG. 7

Consensus objects and safe registers that have the omission-crash or eventual-crash failure modes may be used to construct objects of other types that have the omission-crash failure mode, and consequently may be used to construct objects of other types that are fault-tolerant and gracefully degrading. FIG. 7 shows an object 703 of type n which is constructed of non-fault-tolerant consensus objects and safe registers with the omission-crash failure mode. Object 703 is itself not fault tolerant, but may be made so by replacing each of the non-fault-tolerant consensus objects and safe registers with their fault-tolerant counterparts.

Object 703 is operated on by three processes 701; again, a memory interface 705 responds to requests for operations on object 703 from the processes 701 and returns the results of the operations to process 701. As before, boxes 709 merely indicate that interface 707 provides each process 703 with its own interface to object 705. Object 703 further contains consensus objects 709 and safe registers 713 as required to perform the functions specified for object 703's type, and a local crash flag (LCF) 708 associated with each process 701. The crash flags 708 implement object 705's omission-crash failure mode.

Operation is as follows: At the beginning of operation, all of the local crash flags 708 are initialized to F; the processes 701 then begin performing operations on object 703, which interface 707 turns into operations on the consensus objects 709. Before interface 707 performs an operation on object 703 for a process 701(i), interface 707 examines the process's local crash flag 708(i); if it is set to T, interface 707 simply returns * to process 701(i). If local crash flag 708(i) is not set, interface 707 performs the operation on the consensus objects 709 and safe registers 713; if any of the consensus objects 709 or safe registers 713 returns ' or *, interface 707 returns ? to process 701(i) and sets all of the local crash flags 708. If none of the consensus objects or safe registers 713 returns ? or *, then interface 707 returns the value provided by the consensus objects and safe registers to process 701(i). Object 703 thus has the omission-crash failure mode, and if a fault-tolerant version of object 703 is made, that object will degrade gracefully.

Conclusion

The foregoing Detailed Description has disclosed memories with two novel benign failure modes, omission-crash and eventual-crash, and has shown how such memories can be used to construct gracefully degrading fault tolerant memories. While the Detailed Description has disclosed the best mode presently known to the inventors for implementing their inventions, it will be immediately apparent to those of ordinary skill in the art that many other implementations are possible, and that the details of an implementation will be determined by the devices used to actually store the data. Further, the techniques described herein may be used to deal with faults other than time outs. All of the above being the case, the foregoing Detailed Description is to be understood as being in every respect illustrative and exemplary, but not restrictive, and the scope of the invention disclosed herein is not to be determined from the Detailed Description, but rather from the claims as interpreted with the full breadth permitted by law.

What is claimed is:

1. Memory apparatus for concurrently performing first memory operations for a plurality of processes, the memory apparatus comprising:

potentially faulty memory means for performing second memory operations; and memory interface means which is concurrently accessible to the processes for responding to first memory operations specified by the processes by specifying second memory operations as required to perform the specified first memory operations, the memory interface means including means in the memory interface means for detecting a fault in the memory means, the memory interface means responding to a detected fault by returning a first special value in those of the first memory operations which were being concurrently performed when the fault was detected but had not yet completed their second memory operations, the first special value indicating only termination of the memory operation, and a second special value in those of the first memory operations which were performed subsequent to the detection of the fault, the second special value indicating that the memory apparatus has crashed.

2. Improved memory apparatus which performs memory operations concurrently for a plurality of processes and which includes potentially faulty memory means, the improvement comprising:

means for detecting a fault in the memory means and responding thereto by returning a first special value indicating that a failure is imminent in memory operations which were begun prior to the detection of the fault, continuing to return the first special value in following operations until a time subsequent to the detection of the fault, and thereupon returning a second special value indicating that the memory apparatus has crashed in those memory operations which are begun after the time subsequent.

3. The memory apparatus set forth in claim 2 wherein:

the means for detecting the fault returns the first special value only in memory operations which were not yet complete in the potentially faulty memory means when the fault was detected and the time subsequent is immediately upon detection of the fault.

4. Fault-tolerant memory apparatus for performing memory operations concurrently for a plurality of processes, the fault tolerant memory apparatus comprising:

a plurality of component memories, each component memory having a component interface such that each of the component memories returns a first special value indicating that a failure is imminent in memory operations in the component which were begun prior to the detection of the fault, continues to return the first special value in following operations until a time subsequent to the detection of the fault, and thereupon returns a second special value indicating that the memory apparatus has crashed in those memory operations which are begun after the time subsequent; and memory interface means which is concurrently accessible to the processes for responding to process memory operations specified by the processes for specifying the memory operations in the component memories and returning results thereof to the processes, the memory interface means returning the first special value as a result of a process memory operation when a first number of the components return the first special value and the second special value when a second number of the components return the first or second special value.

5. The fault-tolerant memory apparatus set forth in claim 4 wherein:

the component interlace returns the first special value only in memory operations which were not yet complete in the component memory when the fault was detected and the time subsequent is immediately upon detection of the fault.

6. The fault-tolerant memory apparatus set forth in claim 4 or 5 wherein:

the process memory operations are performed on all of the component memories;

there are $2f+1$ component memories, each component memory being a safe read/write register; and the memory interface means returns the second special value in response to a operation if more than for the component memories return the second special value and the first special value in response thereto if fewer than $f+1$ of the component memories return neither the first special value nor the second special value.

7. The fault-tolerant memory apparatus set forth in claim 5 wherein:

there are $2f+1$ component memories, each component memory being a consensus object having a propose operation;

the memory interface means has a crash flag for each process performing process propose operations on the fault-tolerant memory apparatus;

the process memory operations include a process propose operation which results in performance of a propose operation on each of the component memories; and the memory interface means returns the first special value in response to the process propose operation and sets the crash flags for all of the processes if more than f of the component memories return either the first special value or the second special value in response to the propose operation and returns the second special value if the crash flags are set.

8. Memory apparatus for performing memory operations concurrently for a plurality of processes, the memory apparatus comprising:

a plurality of component memories, each component memory having a component interface such that each of the component memories returns a first special value indicating that a failure is imminent in memory operations in the component which were begun prior to the detection of the fault, continues to return the first special value in following operations until a time subsequent to the detection of the fault, and thereupon returns a second special value indicating that the memory apparatus has crashed in those memory operations which are begun after the time subsequent; and memory interface means which is concurrently accessible to the processes for responding to process memory operations specified by the processes for specifying the memory operations in the component memories and returning results thereof to the processes, the memory interface means including a crash flag for each process and responding to a process memory operation by returning the second special value if the process's crash flag indicates a crash and returning the first special value and setting all of the processes' crash flags to indicate a crash if any of the component memories returns either the first special value or the second special value.

9. The memory apparatus set forth in claim 8 wherein:

each of the component memories in turn has subcomponent memories and returns the first special value when a first number of the subcomponent memories return the first special value and the second special value when a second number of the subcomponents return either the first or second special value.

* * * * *

UNITED STATES PATENT AND TRADEMARK OFFICE
CERTIFICATE OF CORRECTION

PATENT NO. : 5,430,868

DATED : July 4, 1995

INVENTOR(S) : Y. Afek, M. J. Merritt, G. Taubenfeld

It is certified that error appears in the above-identified patent and that said Letters Patent is hereby corrected as shown below:

IN THE CLAIMS:
Column 10:
  Claim 5, line 31, please replace "interlace" with --interface--

Claim 6, lines 43-44, please replace "if more than for the" with
    --if more than f of the--

Signed and Sealed this

Seventeenth Day of October, 1995

BRUCE LEHMAN

Attest:

Attesting Officer

Commissioner of Patents and Trademarks